(12) United States Patent
Wu (10) Patent No.: US 11,133,797 B1
(45) Date of Patent: Sep. 28, 2021

(54) BOOTSTRAP CIRCUIT FOR GATE DRIVER

(71) Applicant: Diodes Incorporated, Plano, TX (US)

(72) Inventor: Wei Wu, Fremont, CA (US)

(73) Assignee: DIODES INCORPORATED, Plano, TX (US)

( * ) Notice: Subject to any disclaimer, the term of this patent is extended or adjusted under 35 U.S.C. 154(b) by 0 days.

(21) Appl. No.: 17/103,853

(22) Filed: Nov. 24, 2020

(51) Int. Cl.
*H03K 3/00* (2006.01)
*H03K 17/687* (2006.01)
*H01L 29/78* (2006.01)
*H02M 1/08* (2006.01)

(52) U.S. Cl.
CPC ..... *H03K 17/6871* (2013.01); *H01L 29/7818* (2013.01); *H02M 1/08* (2013.01)

(58) Field of Classification Search
CPC ... H03K 17/6871; H01L 29/7818; H02M 1/08
USPC .......................................................... 327/109
See application file for complete search history.

(56) References Cited

U.S. PATENT DOCUMENTS

| 2006/0017466 | A1* | 1/2006 | Bryson | ................. | H03F 3/2171 326/88 |
| 2007/0278568 | A1* | 12/2007 | Williams | ........ | H01L 21/823493 257/335 |
| 2011/0075452 | A1* | 3/2011 | Santoro | .................... | H02M 1/38 363/56.1 |
| 2018/0167065 | A1* | 6/2018 | Chan | .................... | H03K 17/567 |

* cited by examiner

*Primary Examiner* — Metasebia T Retebo (57) ABSTRACT

A bootstrap diode circuit includes an anode for coupling to a power supply voltage terminal and a cathode for coupling to a bootstrap voltage terminal. The bootstrap diode circuit also includes a high-voltage p-type metal-oxide-semiconductor (PMOS) transistor, having a source forming the cathode of the bootstrap diode circuit and a drain forming the anode of the bootstrap diode circuit. The high-voltage PMOS transistor has a breakdown voltage higher in magnitude than a voltage drop between a maximum bootstrap voltage and the power supply voltage.

20 Claims, 6 Drawing Sheets

BOOTSTRAP CIRCUIT FOR GATE DRIVER

BACKGROUND OF THE INVENTION

A half-bridge circuit configuration can be used in a variety of applications, such as DC-DC converters, DC-AC converters, AC-DC power supplies, and motor controls Class-D power amplifiers. The half-bridge circuit includes a high-side transistor and a low-side transistor connected in series, with the high-side transistor connected to a high-voltage power supply, which can be much higher than the power supply voltage of a gate driver integrated circuit (IC). Therefore, a gate driver for the half-bridge circuit often uses a bootstrap circuit to generate a higher boosted power supply voltage for the high-side gate driver circuit with enough gate voltage (HS_G) to fully turn ON the high-side transistor. The bootstrap circuit needs a rectifying element between the power supply voltage of the IC and the boosted supply voltage.

In conventional designs, either an external Schottky diode, an internal Schottky diode, or an internal p-n junction diode is used in the bootstrap circuit. The inventor has observed that these conventional designs have many drawbacks. For example, the external Schottky diode requires an extra external component in the bill of materials (BOM) list as well as a larger printed circuit board (PCB) area. The internal Schottky diode fabricated on the same gate driver silicon chip often has a large reverse leakage current, especially when the reverse voltage is high, for example, more than 30V. An internal p-n junction diode has a larger forward voltage drop, which may cause an unacceptable drop in the boosted voltage (VB) when the operating power supply voltage (VDD) is low. In the latter case, an external Schottky diode may still be needed in low-voltage applications. Further, the internal diode may also suffer a large forward injection leakage current to the substrate due to the parasitic PNP transistor.

Another conventional design uses a combination of a medium-voltage p-type metal-oxide-semiconductor (PMOS) transistor and a high-voltage junction field effect transistor (JFET). The JFET sustains the high-voltage drop, and the forward turn-on voltage drop in the PMOS transistor can be made low. However, this circuit requires two devices and more complex design. Further, the JFET also introduces an on resistance and forward voltage drop when it is turned on.

Another known design uses a high-voltage n-type metal-oxide-semiconductor NMOS transistor as part of a diode circuit. However, a charge pump is needed in the control circuit to provide gate-source turn-on voltage. This design increases the number of components and the complexity.

Therefore, an improved bootstrap diode device is highly desirable.

BRIEF SUMMARY OF THE INVENTION

This invention teaches using a single high-voltage p-type metal-oxide-semiconductor field effect transistor (PMOSFET or PMOS) switch as the bootstrap diode circuit. The new circuit has near-to-zero forward voltage drop, very small reverse leakage current, no forward injection current risk, and one fewer component from the BOM list. A constant current source can be used to provide a constant gate-source voltage for turning on the PMOSFET switch independent of the power supply voltage.

For example, this invention teaches a bootstrap diode circuit that includes an anode for coupling to a power supply voltage terminal, a cathode for coupling to a bootstrap voltage terminal, a high-voltage p-type metal-oxide-semiconductor transistor (PMOS), and a bootstrap control circuit. The high-voltage PMOS has a source forming the cathode of the bootstrap diode circuit and a drain forming the anode of the bootstrap diode circuit. The high-voltage PMOS transistor has a breakdown voltage higher in magnitude than a voltage drop between a maximum bootstrap voltage and a power supply voltage. The bootstrap control circuit turns on the high-voltage PMOS transistor in response to a control signal. The bootstrap control circuit includes a resistor coupled between the source and a gate of the high-voltage PMOS transistor and a constant current source and a current mirror coupled to the gate of the high-voltage PMOS transistor. The bootstrap control circuit is configured to provide a constant gate-source voltage to turn on the high-voltage PMOS transistor independent of the power supply voltage and the bootstrap voltage.

For example, in an exemplary bootstrap diode circuit, the current mirror includes a first transistor and a second transistor, and the current source includes a first switch and a second switch responsive to the control signal. The first switch is coupled between the gate of the constant current source and the first transistor of the current mirror. and the second switch is coupled between the gate of the high-voltage PMOS transistor and the second transistor of the current mirror.

In the bootstrap diode circuit, the high-voltage PMOS transistor is the only high-voltage transistor coupled between the anode and the cathode. In an example, the high-voltage PMOS transistor comprises an asymmetric P-channel device having a drift region for sustaining a high voltage drop.

In another example, the invention teaches a bootstrap diode circuit that includes an anode for coupling to a power supply voltage terminal, a cathode for coupling to a bootstrap voltage terminal, and a high-voltage PMOS transistor having a source forming the cathode of the bootstrap diode circuit and a drain forming the anode of the bootstrap diode circuit. The high-voltage PMOS transistor has a breakdown voltage higher in magnitude than a voltage drop between a maximum bootstrap voltage and the power supply voltage.

In another example, the invention teaches a gate driver circuit that includes an input terminal for receiving an input switching signal for driving a switching half-bridge circuit having a high-side transistor and a low-side transistor serially coupled at a midpoint, the midpoint providing an output for the switching half-bridge circuit. The gate driver circuit also includes a power supply voltage terminal for receiving operating power for the gate driver circuit, a first output terminal for providing a first gate drive signal for driving the high side transistor, a second output terminal for providing a second gate drive signal for driving the low-side transistor, a third output terminal for coupling to the midpoint of the switching half-bridge circuit, and a bootstrap voltage terminal for coupling to a bootstrap capacitor that is coupled to the midpoint of the switching half-bridge circuit. The gate driver circuit also includes and a bootstrap diode circuit having an anode and a cathode. The anode is coupled to the power supply voltage terminal, and the cathode is coupled to the bootstrap voltage terminal. The bootstrap voltage is higher than the power supply voltage. The bootstrap diode circuit includes an anode for coupling to a power supply voltage terminal, a cathode for coupling to a bootstrap voltage terminal, and a high-voltage PMOS transistor having a source forming the cathode of the bootstrap diode circuit and a drain forming the anode of the bootstrap diode circuit. The high-voltage PMOS transistor is characterized by a breakdown voltage higher in magnitude than a voltage drop between a maximum bootstrap voltage and the power supply voltage.

DEFINITIONS

The terms used in this disclosure generally have their ordinary meanings in the art within the context of the invention. Certain terms are discussed below to provide additional guidance to the practitioners regarding the description of the invention. It will be appreciated that the same thing may be said in more than one way. Consequently, alternative language and synonyms may be used.

A half-bridge circuit as used herein refers to a switching circuit having a high-side transistor and a low-side transistor vertically stacked and connected at a midpoint.

Dead-time as used herein refers to the time during which both a high-side transistor and a low-side transistor in a half-bridge switching circuit are turned off.

A power switch as used herein refers to a semiconductor switch, for example, a transistor, that is designed to handle high power levels.

A power MOSFET is a specific type of metal oxide semiconductor field-effect transistor (MOSFET) designed to handle significant power levels. An example of a power MOSFET for switching operations is called double-diffused MOS or simply DMOS.

An insulated-gate bipolar transistor (IGBT) as used herein refers to a three-terminal power semiconductor device primarily used as an electronic switch that combines high efficiency and fast switching.

A power converter is an electrical or electromechanical device for converting electrical energy, such as converting between AC and DC or changing the voltage, current, or frequency, or some combinations of these conversions. A power converter often includes voltage regulation.

A switching regulator, or switch mode power supply (SMPS), uses an active device that switches on and off to maintain an average value of output. In contrast, a linear regulator is made to act like a variable resistor, continuously adjusting a voltage divider network to maintain a constant output voltage and continually dissipating power.

A voltage reference is an electronic device that ideally produces a fixed (constant) voltage irrespective of the loading on the device, power supply variations, temperature changes, and the passage of time.

A reference voltage is a voltage value that is used as a target for a comparison operation.

When the phrase "the same" is used to describe two quantities, it means that the values of two quantities are determined the same within measurement limitations.

DETAILED DESCRIPTION OF THE INVENTION

Figure 1:
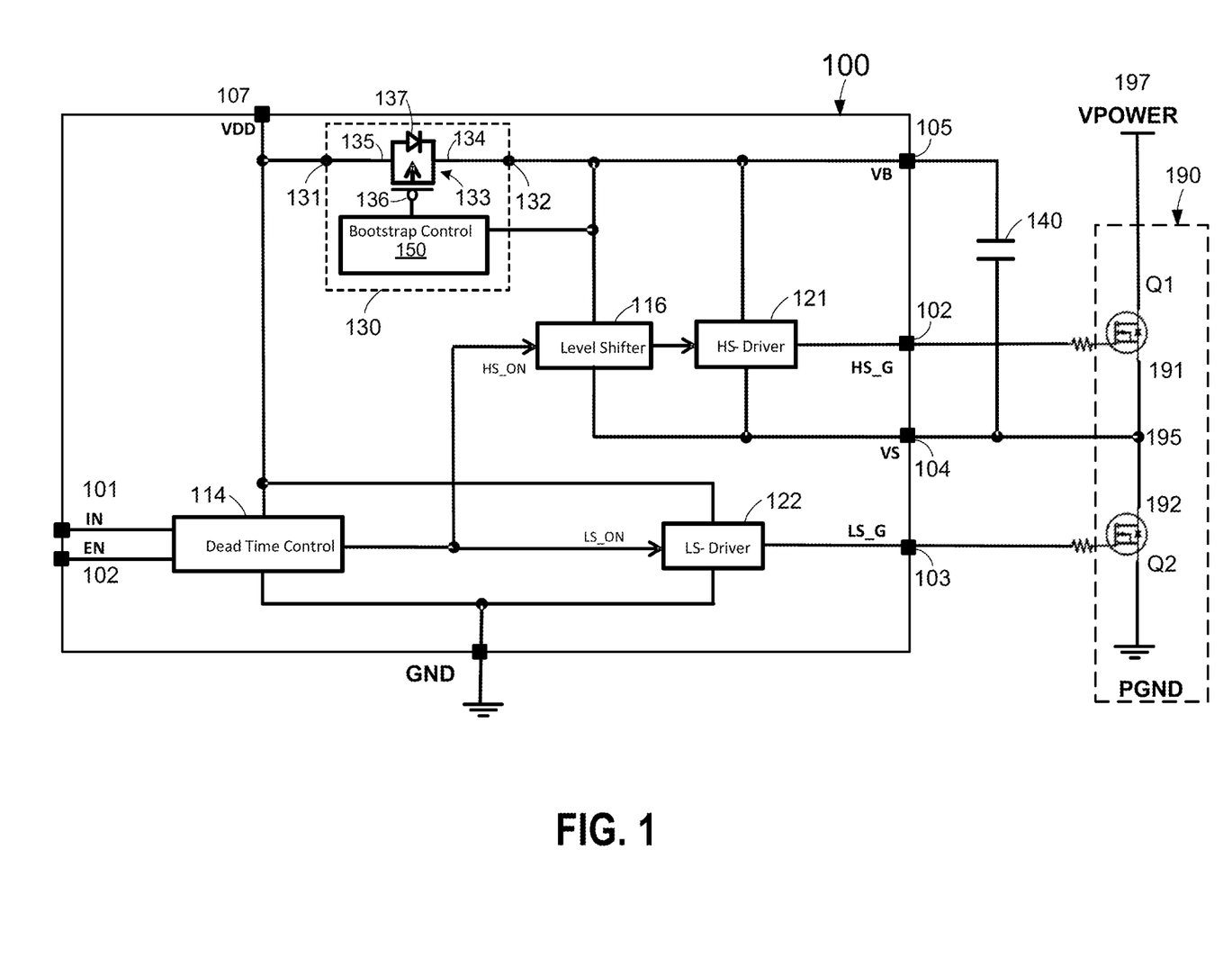
FIG. 1 is a simplified block diagram illustrating a gate driver circuit that embodies certain aspects of this invention.

FIG. 1 is a simplified block diagram illustrating another gate driver circuit that embodies certain aspects of this invention. As shown in FIG. 1, a gate driver circuit 100 includes an input terminal 101 for receiving an input switching signal IN for driving a switching half-bridge circuit 190 that includes a high-side transistor 191 (Q1) and a low-side transistor 192 (Q2) connected in series at a midpoint 195 between a power terminal 197 providing a voltage VPOWER and a ground terminal labeled PGND. The midpoint 195 provides an output for switching half-bridge circuit 190. Gate driver circuit 100 operates between a power supply voltage VDD at a power supply terminal 107 and a ground labeled GND. In some examples, PGND is a ground separated from GND, which is the ground for all internal circuits of the gate driver circuit 100. PGND and GND can both be connected to a system ground on the PCB.

Gate driver circuit 100 also includes a first output terminal 102 for providing a first output signal HS_G for driving the high-side transistor Q1 and a second output terminal 103 for providing a second output signal LS_G for driving the low-side transistor Q2. Gate driver circuit 100 also includes a bootstrap voltage terminal 105 with a voltage VB for coupling to a bootstrap capacitor 140 that is coupled to the midpoint 195 of the switching half-bridge circuit 190.

In FIG. 1, gate driver circuit 100 also includes a dead-time control circuit 114. A half-bridge configuration in a power converter often has a high-side N-channel MOSFET and a low-side N-channel MOSFET connected at a common node. If both of the N-channel MOSFETs are turned on simultaneously, a shoot-through current will flow from supply to ground, which may be large enough to damage the MOSFETs. Therefore, a delay time is usually introduced after the first MOSFET is turned off and before the second MOSFET is turned on. This time period is known as the dead-time, during which neither the high-side MOSFET nor the low-side MOSFET is turned on. Dead-time control circuit 114 introduces a proper dead-time between switching cycles.

In response to an input switching signal 101 (IN) and an enable signal 108 (EN), dead-time control circuit 114 generates a first gate control signal HS_ON for turning on the high-side transistor 191 (Q1) and a second gate control signal LS_ON for turning on the low-side transistor 192 (Q2).

As shown in FIG. 1, gate driver circuit 100 also includes a high-side driver 121 (HS_Driver) and a low-side driver 122 (LS_Driver). High-side driver 121 generates the first output signal HS_G based on the first gate control signal HS_ON. Low-side driver 122 generates the second output signal LS_G based on the second gate control signal LS_ON.

In a half-bridge configuration, the gate voltage HS_G of high-side transistor Q1 is a high-voltage signal. Therefore, a level shifter 116 is provided between HS_G and the dead-time control circuit 114. In half-bridge configurations, such as for a power converter or an SMPS, transistors Q1 and Q2 can be power switches, such as MOSFETs or IGBTs. Gate driver circuit 100 also has a virtual source terminal 104

(VS), which is coupled to the midpoint 195 of half-bridge circuit 190, which in turn is coupled to a source terminal of HS MOSFET 191 and a drain terminal of LS MOSFET 192. The VS terminal also serves as a virtual ground for the high-voltage devices and circuits, for example, the level shifter circuit 116 and the HS gate driver circuit 121.

Gate driver circuit 100 also includes a bootstrap diode device 130. Bootstrap diode circuit 130 includes an anode 131 for coupling to a power supply voltage terminal VDD and a cathode 132 for coupling to a bootstrap voltage terminal VB. Bootstrap diode circuit 130 also includes a high-voltage PMOS transistor 133 having a source 134 forming the cathode of the bootstrap diode circuit and a drain 135 forming the anode of the bootstrap diode circuit. High-voltage PMOS transistor 133 also has a gate 136 and a body diode 137. As explained further below, the high-voltage PMOS transistor 133 is characterized by a breakdown voltage higher in magnitude than a voltage drop between a maximum bootstrap voltage at VB and the power supply voltage at VDD.

Bootstrap diode circuit 130 also includes a bootstrap control circuit 150 configured to turn on high-voltage PMOS transistor 133 to allow power supply voltage at VDD to charge the bootstrap capacitor 140. Bootstrap control circuit 150 is also configured to turn off high-voltage PMOS transistor 133 when the bootstrap voltage at VB is raised to a higher voltage than the power supply voltage at VDD.

In operation, when IN is LOW, HS_ON/HS_G is LOW; the HV PMOSFET is close, which is similar to a forward diode except the voltage drop is much smaller (e.g., <100 mV); and current from VDD is through the P-MOSFET and charged into the bootstrap capacitor 140 between VB and VS. When IN is HIGH, HS_ON and HS_G are HIGH, turning on the high-side transistor 191 (Q1) and pulling up voltage VB, which is coupled to the midpoint 195 and the source node of the high-side transistor 191 (Q1). At this point, the voltage VB is raised to a voltage close to VDD+VPOWER, which can be substantially higher than VDD. Therefore, the P-MOSFET needs to be turned off to prevent the charges on bootstrap capacitor 140 from flowing back to the power supply voltage VDD. In this manner, the bootstrap diode device operates similarly to a diode in a reverse bias.

In the example of FIG. 1, the gate driver circuit 100 is included in an integrated circuit (IC) chip, and the bootstrap capacitor 140 is shown to be external to the IC chip. In some embodiments, the bootstrap capacitor 140 can be included in a same integrated circuit (IC) chip as the gate driver circuit 100.

Figure 2:
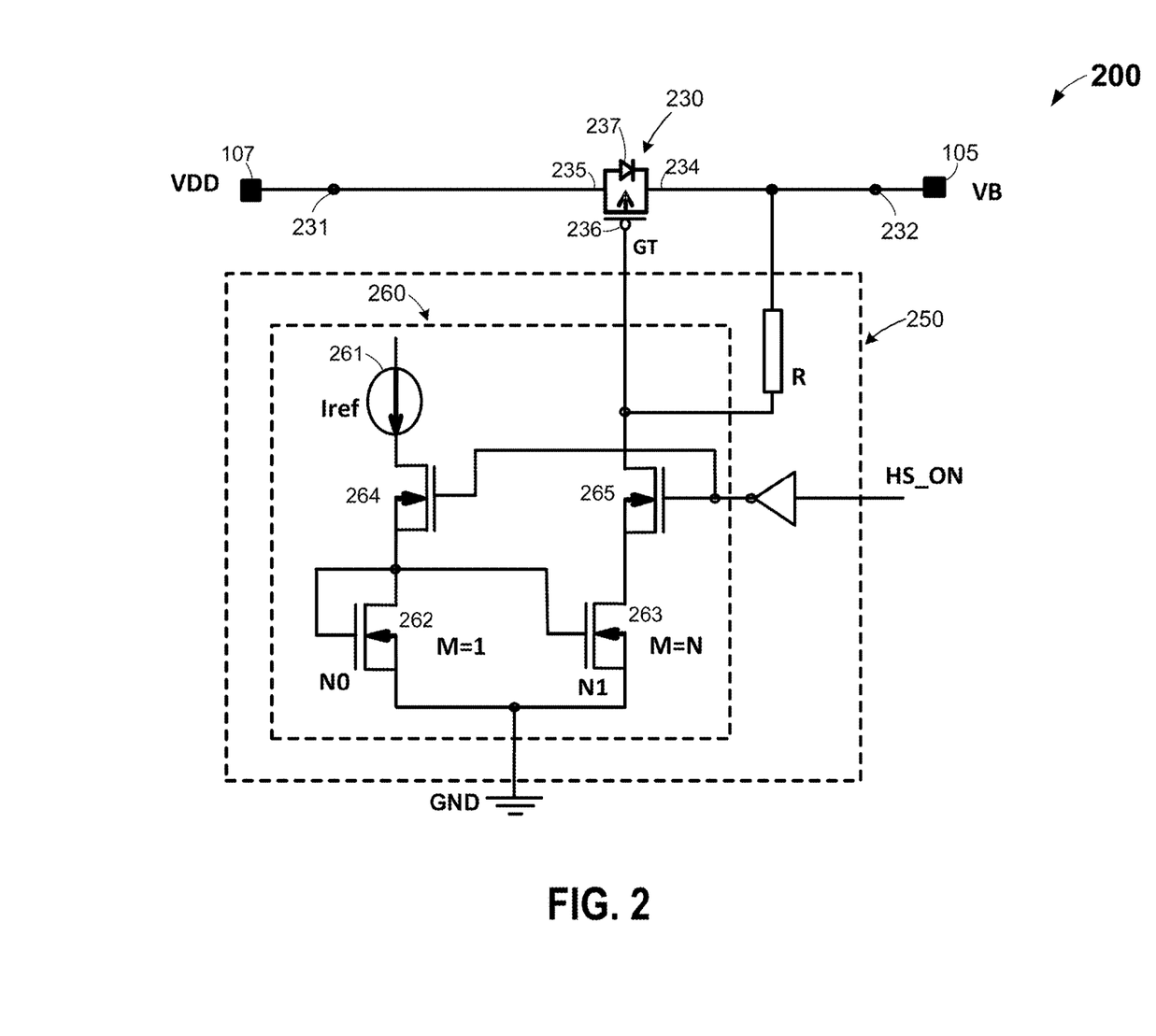
FIG. 2 is a simplified block diagram illustrating a bootstrap diode circuit for the gate driver circuit of FIG. 1 that embodies certain aspects of this invention.

FIG. 2 is a simplified block diagram illustrating a bootstrap diode circuit for the gate driver circuit of FIG. 1 that embodies certain aspects of this invention. Bootstrap diode circuit 200 in FIG. 2 is an example of a bootstrap diode circuit that can be used as bootstrap diode circuit 130 in gate driver circuit 100 of FIG. 1. As shown in FIG. 2, bootstrap diode circuit 200 includes an anode 231 for coupling to a power supply voltage terminal VDD and a cathode 232 for coupling to a bootstrap voltage terminal VB. Bootstrap diode circuit 230 also includes a high-voltage PMOS transistor 230 having a source 234 forming the cathode of the bootstrap diode circuit and a drain 235 forming the anode of the bootstrap diode circuit. High-voltage PMOS transistor 230 also has a gate 236 and a body diode 237. The high-voltage PMOS transistor 230 is characterized by a breakdown voltage higher in magnitude than a voltage drop between a maximum bootstrap voltage at VB and the power supply voltage at VDD.

Bootstrap diode circuit 200 also includes a bootstrap control circuit 250 configured to turn on high-voltage PMOS transistor 230 to allow power supply voltage at VDD to charge a bootstrap capacitor. Bootstrap control circuit 250 is also configured to turn off high-voltage PMOS transistor 230 when the bootstrap voltage at VB is raised to a higher voltage than the power supply voltage at VDD.

As shown in FIG. 2, bootstrap control circuit 250 includes a resistor R coupled between the source 234 and gate 236 of the high-voltage PMOS transistor 230, and a current source 260 coupled to the gate 236 of the high-voltage PMOS transistor 230. The current source 260 can be configured to be turned on by a control signal HS_ON to cause a current flow in the resistor R resulting in a gate-source voltage Vgs to turn on the high-voltage PMOS transistor 230.

In this example, current source 260 includes a constant current source 261 with a current Iref and a current mirror formed by transistors 262 (N0) and 263 (N1), providing a constant gate-source voltage Vgs of the high-voltage PMOS transistor 230. As an example, constant current source 261 can generated with a transistor using a constant reference voltage derived from power supply voltage VDD. Since Iref is constant, the Vgs of high-voltage PMOS transistor 230 can be expressed as follows:

$$Vgs = V(GT) - V(VB) = Iref \times N \times R,$$

where N is the transistor size ratio between transistors 262 and 263. Therefore, Vgs is independent of the power supply voltage VDD and the bootstrap voltage VB. Further, appropriate values for N and R, as well as MOSFET size, can be selected to meet design requirements.

Current source 260 also includes high-voltage NMOS transistors as a first switch 264 and a second switch 265, respectively, responsive to the control signal, which in this example is HS_ON. It can be seen in FIG. 2 that the first switch 264 is coupled between the constant current source Iref and the first transistor 261 of the current mirror. The second switch 265 is coupled between the gate 236 of the high-voltage PMOS transistor 230 and the second transistor 263 of the current mirror.

The bootstrap diode circuit as described here can offer many advantages. Depending on the implementation, one or more of the following advantages can be realized. For example, there is near-to-zero voltage drop on the P-MOSFET, no forward ejection current when the high-voltage P-MOSFET is closed, very small reverse leakage current when the P-MOSFET is open, and fewer components from the BOM list. The design is simpler and the cost can be lowered. Moreover, the low forward voltage drop allows the bootstrap diode device to be used with a low power supply voltage, e.g., 4V or lower.

The high-voltage PMOS transistor in bootstrap diode device 133 of FIG. 1 and bootstrap diode device 230 of FIG. 2 is characterized by a breakdown voltage higher in magnitude than a voltage drop between a maximum bootstrap voltage and the power supply voltage. As an example, VDD is 12V and VPOWER is 100V, and the high-voltage PMOS transistor needs to sustain a voltage drop as high as 88V. In some applications, VPOWER can be as high as 600 V-700 V. In such cases, an appropriate high-voltage PMOS device can be used. An example of the high-voltage PMOS transistor is described below with reference to FIG. 3.

Figure 3:
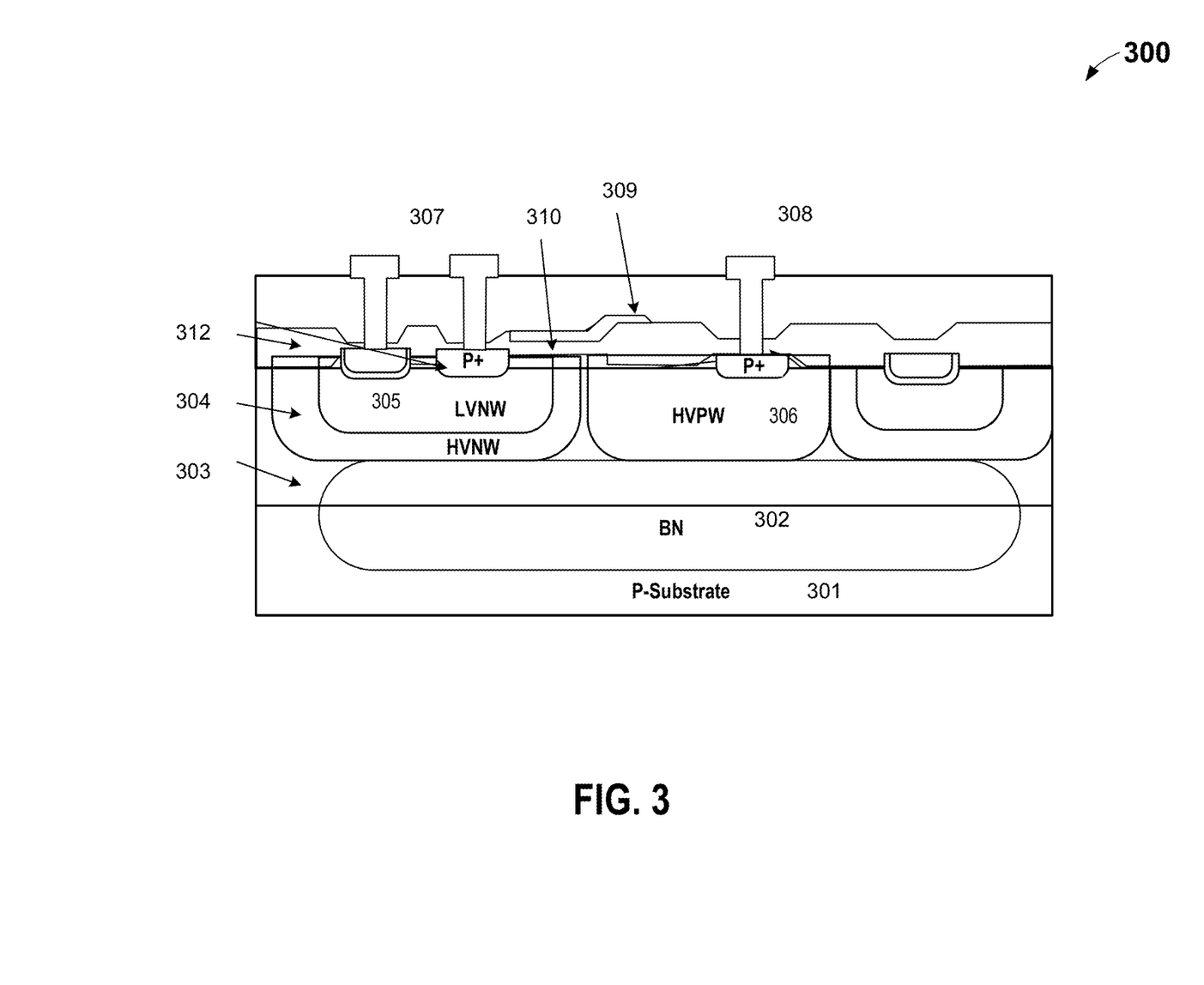
FIG. 3 is a cross-sectional view diagram that illustrates a high-voltage PMOS for the bootstrap diode circuit of FIGS. 1-3 that embodies certain aspects of this invention.

FIG. 3 is a cross-sectional view diagram that illustrates a high-voltage PMOS transistor for the bootstrap diode circuit of FIGS. 1-2 that embodies certain aspects of this invention. As shown in FIG. 3, high-voltage PMOS transistor 300 includes a p-type silicon substrate 301, a buried n-type layer 302 (BN), an n-well region 303, a high-voltage n-well region 304 (HVNW) on the buried n-type layer 302, and an n-well region 305 (LVNW). A first p+ region 307 forms the drain of high-voltage PMOS transistor 300, and a second p+ region 308 forms the source of high-voltage PMOS transistor 300. A gate region 309 overlies a gate dielectric region 310. Field oxide regions 312 overlie the surface of the device to isolate various regions.

High-voltage PMOS transistor 300 in FIG. 3 is an example of a P-channel asymmetric device. High-voltage PMOS transistor 300 has a gate dielectric region 310, which is located upon n-well 305 and HVNW 304. Gate dielectric region 310 has an appropriate thickness depending on the voltage for operation. HVPW 306 is used as a drift region, which is isolated from p-type silicon substrate 301 by HVNW 304 and BN 302. High-voltage PMOS transistor 300 in FIG. 3 can be designed to have a breakdown voltage higher in magnitude than a voltage drop between a maximum bootstrap voltage and the power supply voltage.

As described above, bootstrap diode circuit 230 in FIG. 2 operates in the low-voltage power domain of VDD/GND. In an alternative design, a bootstrap diode circuit can be configured to operate in a high-voltage power domain. An example is described below with reference to FIG. 4.

Figure 4:
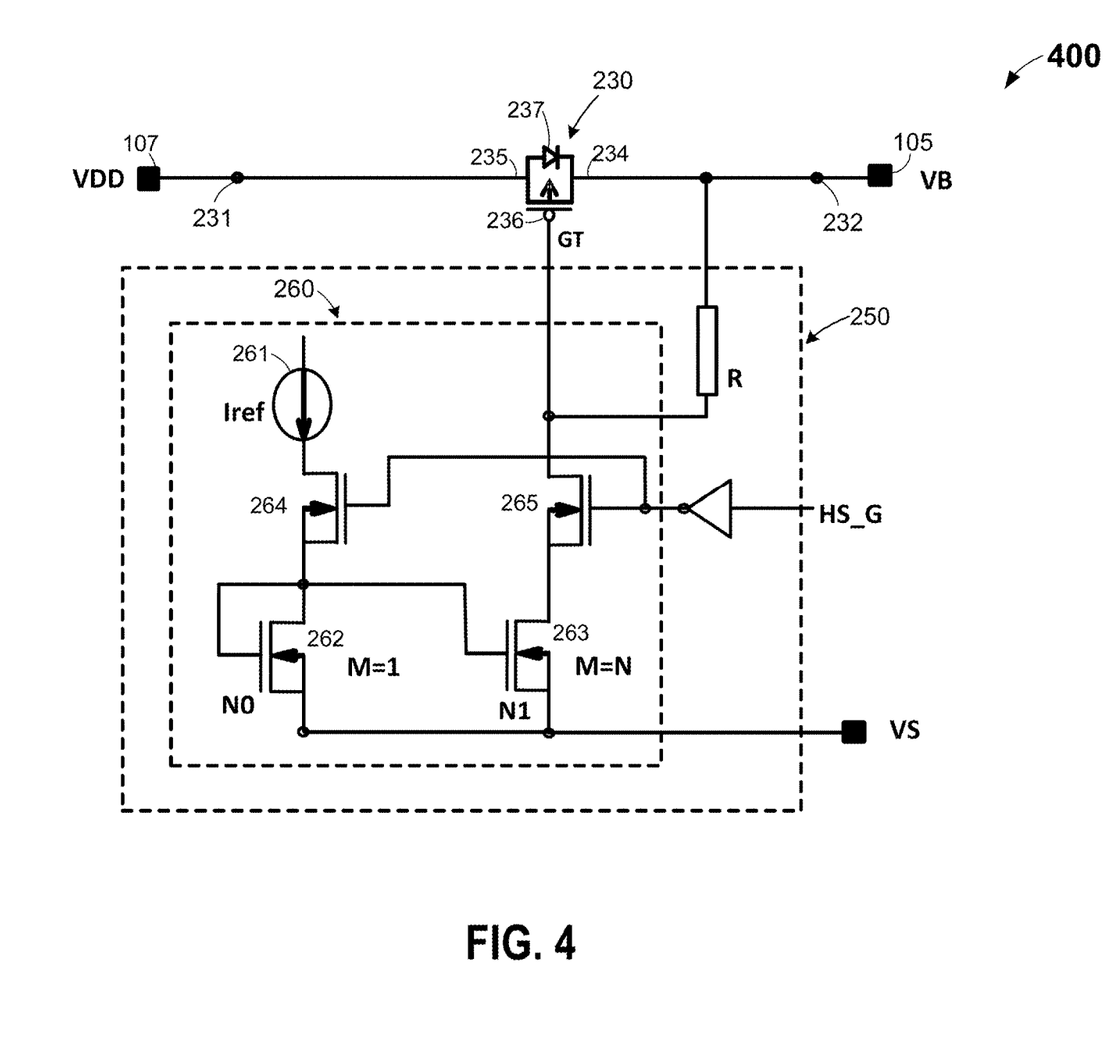
FIG. 4 is a simplified block diagram illustrating another bootstrap diode circuit for the gate driver circuit of FIG. 1 that embodies certain aspects of this invention.

FIG. 4 is a simplified block diagram illustrating another bootstrap diode circuit for the gate driver circuit of FIG. 1 that embodies certain aspects of this invention. Bootstrap diode circuit 400 in FIG. 4 is another example of a bootstrap diode circuit that can be used as bootstrap diode circuit 130 in gate driver circuit 100 of FIG. 1. Bootstrap diode circuit 400 is similar to bootstrap diode circuit 200 of FIG. 2. However, two voltage drops are noted here. First, the ground node for the bootstrap control circuit is at VS, the virtual ground for high-voltage operation of the gate driver circuit. Second, the switching signal for controlling the on and off of the high-voltage PMOS transistor is HS_G, the level-shifted version of signal HS_ON. Further, some of the device components may need to be modified for high-voltage considerations. A more detailed description of bootstrap diode circuit 400 is presented below with the same reference labels for similar components as those in bootstrap diode circuit 200 of FIG. 2.

As shown in FIG. 4, bootstrap diode circuit 400 includes an anode 231 for coupling to a power supply voltage terminal VDD and a cathode 232 for coupling to a bootstrap voltage terminal VB. Bootstrap diode circuit 400 also includes a high-voltage PMOS transistor 230 having a source 234 forming the cathode of the bootstrap diode circuit and a drain 235 forming the anode of the bootstrap diode circuit. High-voltage PMOS transistor 230 also has a gate 236 and a body diode 237. The high-voltage PMOS transistor 230 is characterized by a breakdown voltage higher in magnitude than a voltage drop between a maximum bootstrap voltage at VB and the power supply voltage at VDD.

Bootstrap diode circuit 400 also includes a bootstrap control circuit 250 configured to turn on high-voltage PMOS transistor 230 to allow power supply voltage at VDD to charge a bootstrap capacitor. Bootstrap control circuit 250 is also configured to turn off high-voltage PMOS transistor 230 when the bootstrap voltage at VB is raised to a higher voltage than the power supply voltage at VDD.

As shown in FIG. 4, bootstrap control circuit 250 includes a resistor R coupled between the source 234 and gate 236 of the high-voltage PMOS transistor 230, and a current source 260 coupled to the gate 236 of the high-voltage PMOS transistor 230. The current source 260 can be configured to be turned on by a control signal HS_G to cause a current flow in the resistor R resulting in a gate-source voltage Vgs to turn on the high-voltage PMOS transistor 230.

In this example, current source 260 includes a constant current source 261 with a current Iref and a current mirror formed by transistors 262 and 263, providing a constant gate-source voltage Vgs of the high-voltage PMOS transistor 230. As an example, constant current source 261 can be generated with a transistor using a constant reference voltage derived from power supply voltage VDD. Since Iref is constant, the Vgs of high-voltage PMOS transistor 230 can be expressed as follows:

$$Vgs = V(GT) - V(VB) = Iref \times N \times R,$$

where N is the transistor size ratio between transistors 262 and 263. Therefore, Vgs is independent of the power supply voltage VDD and the bootstrap voltage VB. Further, appropriate values for N and R, as well as MOSFET size, can be selected to meet design requirements.

Current source 260 also includes a first switch 264 and a second switch 265 responsive to the control signal, which in this example is HS_G. It can be seen in FIG. 4 that the first switch 264 is coupled between the constant current source Iref and the first transistor 261 of the current mirror. The second switch 265 is coupled between the gate 236 of the high-voltage PMOS transistor 230 and the second transistor 263 of the current mirror.

The bootstrap diode circuit as described here can offer one or more of the following advantages. For example, there is near-to-zero voltage drop on the P-MOSFET, no forward ejection current when the high-voltage P-MOSFET is closed, very small reverse leakage current when the P-MOSFET is open, and fewer components from the BOM list. The design is simpler and the cost can be lowered.

Figure 5:
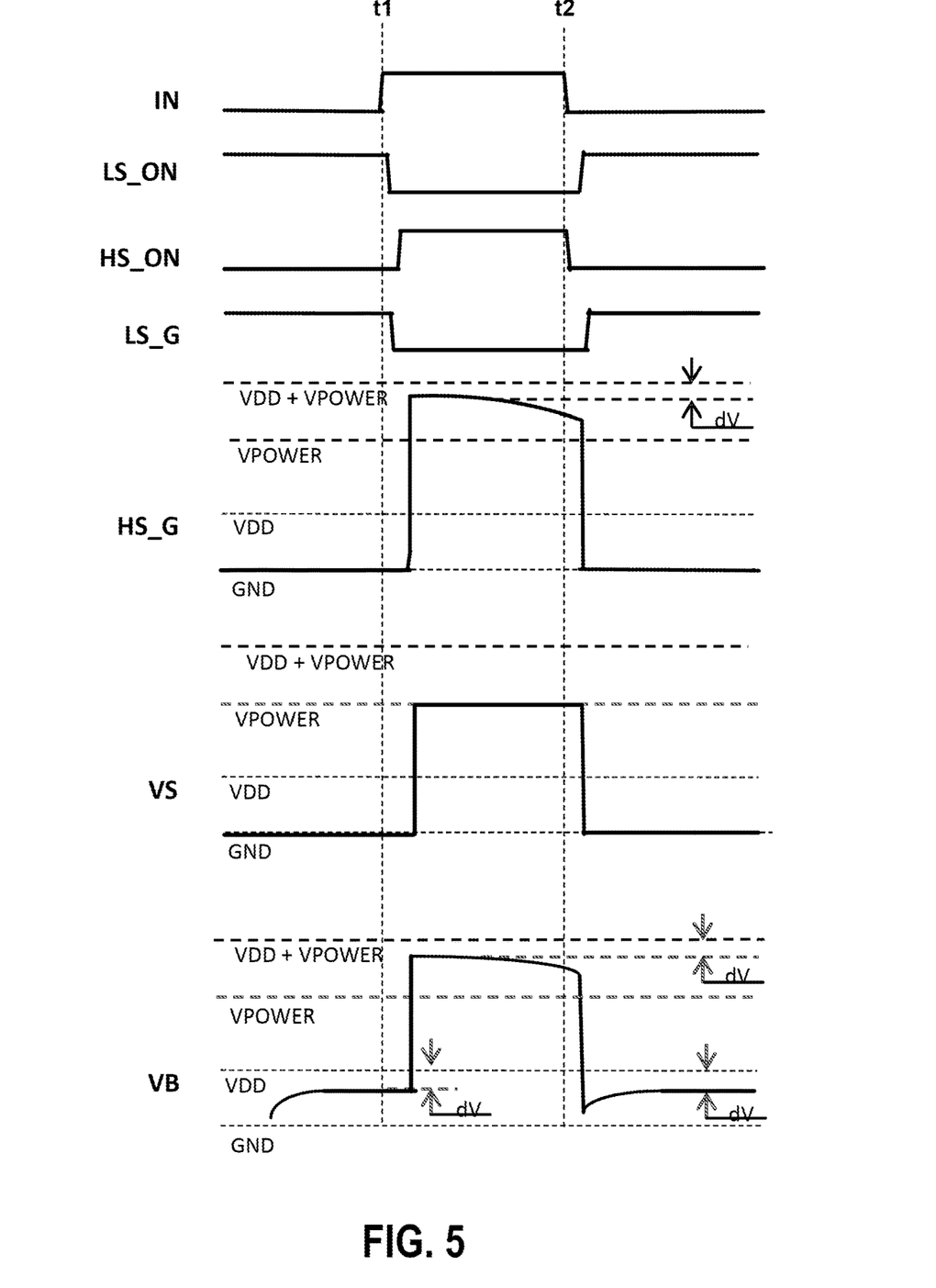
FIG. 5 is a waveform diagram that illustrates the operation of a bootstrap circuit implemented with a junction diode or a Schottky diode in a conventional gate driver circuit.
Figure 6:
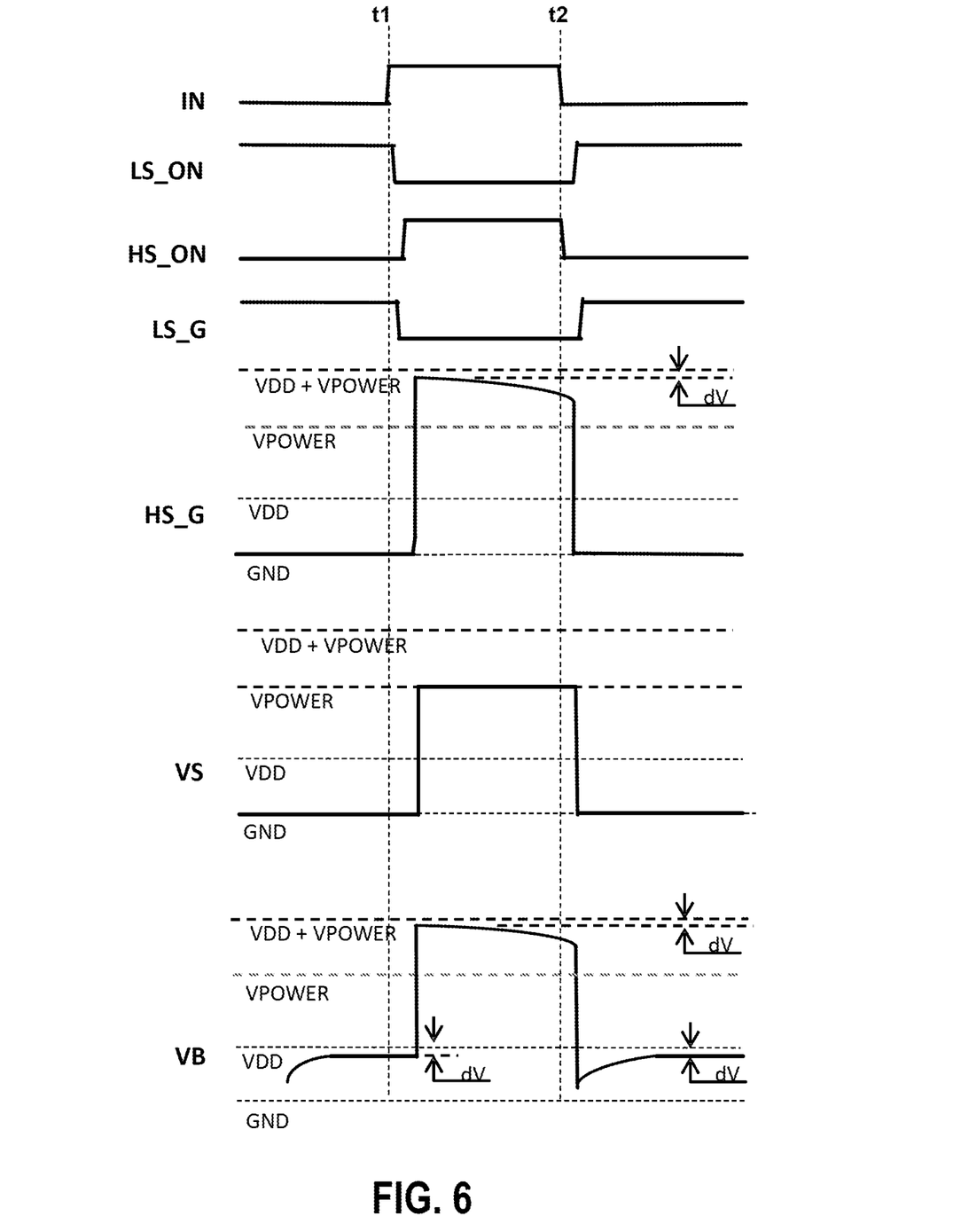
FIG. 6 is a waveform diagram that illustrates the operation of a bootstrap circuit in the gate driver circuit of FIG. 1 that embodies certain aspects of this invention.

FIG. 5 is a waveform diagram that illustrates the operation of a bootstrap circuit implemented with a junction diode or Schottky diode in a gate driver circuit, and FIG. 6 is a waveform diagram that illustrates the operation of a bootstrap circuit in the gate driver circuit of FIG. 1 that embodies certain aspects of this invention.

In both FIG. 5 and FIG. 6, the waveforms of the following signals are illustrated.

IN—input switching signal for alternately turning on the low-side transistor or the high-side transistor LS_ON—gate control signal in the low-voltage VDD/GND power domain for turning on the low-side transistor HS_ON—gate control signal in the low-voltage VDD/GND power domain for turning on the high-side transistor LS_G—gate control signal in the high-voltage VDD+VPOWER/VS power domain for turning on the low-side transistor HS_G—gate control signal in the high-voltage VDD/GND power domain for turning on the high-side (HS) transistor VS—a terminal coupled to the midpoint of the half-bridge output circuit, serving as a virtual ground for the high-voltage VDD+VPOWER/VS power domain VB—the bootstrap voltage terminal coupled to the bootstrap capacitor; VB provides operating power for the circuit components in the high-voltage VDD+VPOWER/VS power domain In both FIG. 5 and FIG. 6, at time t1, input switching signal IN is raised to a high value, LS_ON goes low, and HS_ON goes high, with some delay. Similarly, LS_G goes low and HS_G goes high. Further, VS goes high and VB goes high. At time t2, input switching signal IN is lowered to a low value, LS_ON goes high, and HS_ON goes low, with some delay. Similarly, LS_G goes high and HS_G goes low. Further, VS goes low and VB goes low.

In FIG. 5, with a junction diode or Schottky diode as the bootstrap diode device, the voltage at the bootstrap voltage terminal VB can only be charged to VDD−dV, or VDD+VPOWER−dV, in which dV is about 200 mV-300 mV with a Schottky diode or about 700 mV with a junction diode. In FIG. 6, with the bootstrap diode device having a high-voltage PMOS transistor and a bootstrap control circuit, the forward voltage drop dV can be as small as 100 mV or lower. The forward voltage drop can even be made near to zero, with appropriate selection of P-MOSFET size and switching signal on IN.

The bootstrap diode circuit as described here can offer one or more of the following advantages. For example, there is near-to-zero voltage drop on the P-MOSFET, no forward ejection current when the high-voltage P-MOSFET is closed, very small reverse leakage current when the P-MOSFET is open, and fewer components from the BOM list. The design is simpler and the cost can be lowered.

What is claimed is:

1. A bootstrap diode circuit, comprising:
   an anode for coupling to a power supply voltage terminal;
   a cathode for coupling to a bootstrap voltage terminal;
   a high-voltage p-type metal-oxide-semiconductor (PMOS) transistor, having a source forming the cathode of the bootstrap diode circuit and a drain forming the anode of the bootstrap diode circuit, wherein the high-voltage PMOS transistor has a breakdown voltage higher in magnitude than a voltage drop between a maximum bootstrap voltage and a power supply voltage; and
   a bootstrap control circuit for turning on the high-voltage PMOS transistor in response to a control signal, the bootstrap control circuit including:
      a resistor directly connected between the source and a gate of the high-voltage PMOS transistor; and
      a constant current source and a current mirror coupled to the gate of the high-voltage PMOS transistor, configured to provide a constant gate-source voltage to turn on the high-voltage PMOS transistor independent of the power supply voltage and the bootstrap voltage.

2. The bootstrap diode circuit of claim 1, wherein the current mirror includes a first transistor and a second transistor, and the current source further comprises a first switch and a second switch responsive to the control signal, wherein:
   the first switch is coupled between the gate of the constant current source and the first transistor of the current mirror; and
   the second switch is coupled between the gate of the high-voltage PMOS transistor and the second transistor of the current mirror.

3. The bootstrap diode circuit of claim 1, wherein the high-voltage PMOS transistor is the only high-voltage transistor coupled between the anode and the cathode.

4. The bootstrap diode circuit of claim 1, wherein the high-voltage PMOS transistor comprises an asymmetric P-channel device having a drift region for sustaining a high voltage drop.

5. A bootstrap diode circuit, comprising:
   an anode for coupling to a power supply voltage terminal;
   a cathode for coupling to a bootstrap voltage terminal;
   a high-voltage p-type metal-oxide-semiconductor (PMOS) transistor having a source forming the cathode of the bootstrap diode circuit and a drain forming the anode of the bootstrap diode circuit;
   a current source coupled to a gate of the high-voltage PMOS transistor; and
   a resistor directly connected between the source and the gate of the high-voltage PMOS transistor,
   wherein the high-voltage PMOS transistor has a breakdown voltage higher in magnitude than a voltage drop between a maximum bootstrap voltage and the power supply voltage; and
   a gate-source voltage to turn on the high-voltage PMOS transistor independent of the power supply voltage and the bootstrap voltage.

6. The bootstrap diode circuit of claim 5, wherein
   the current source is configured to be turned on by a control signal to cause a current flow in the resistor resulting in a gate-source voltage to turn on the high-voltage PMOS transistor.

7. The bootstrap diode circuit of claim 6, wherein the current source comprises a constant current source and a current mirror, providing a constant gate-source voltage of the high-voltage PMOS transistor independent of the power supply voltage and the bootstrap voltage.

8. The bootstrap diode circuit of claim 7, wherein the constant current source comprises an MOS transistor controlled by a constant reference voltage.

9. The bootstrap diode circuit of claim 7, wherein the current mirror includes a first transistor and a second transistor, and the current source further comprises a first switch and a second switch responsive to the control signal, wherein:
   the first switch is coupled between the gate of the constant current source and the first transistor of the current mirror; and
   the second switch is coupled between the gate of the high-voltage PMOS transistor and the second transistor of the current mirror.

10. The bootstrap diode circuit of claim 5, wherein the high-voltage PMOS transistor comprises an asymmetric P-channel device having a drift region for sustaining a high voltage drop.

11. The bootstrap diode circuit of claim 5, wherein the high-voltage PMOS transistor is the only high-voltage transistor coupled between the anode and the cathode.

12. A gate driver circuit, comprising:
   an input terminal for receiving an input switching signal for driving a switching half-bridge circuit having a high-side transistor and a low-side transistor serially coupled at a midpoint, the midpoint providing an output for the switching half-bridge circuit;
   a power supply voltage terminal for receiving operating power for the gate driver circuit;
   a first output terminal for providing a first gate drive signal for driving the high-side transistor;
   a second output terminal for providing a second gate drive signal for driving the low-side transistor;
   a third output terminal for coupling to the midpoint of the switching half-bridge circuit;
   a bootstrap voltage terminal for coupling to a bootstrap capacitor that is coupled to the midpoint of the switching half-bridge circuit; and
   a bootstrap diode circuit having an anode and a cathode, the anode coupled to the power supply voltage terminal and the cathode coupled to the bootstrap voltage terminal, a bootstrap voltage being higher than the power supply voltage,
wherein the bootstrap diode circuit includes:
an anode for coupling to the power supply voltage terminal;
a cathode for coupling to the bootstrap voltage terminal; and
a high-voltage p-type metal-oxide-semiconductor (PMOS) transistor, having a source forming the cathode of the bootstrap diode circuit and a drain forming the anode of the bootstrap diode circuit; and
a bootstrap control circuit providing a constant gate-source voltage of the high-voltage PMOS transistor independent of the power supply voltage and the bootstrap voltage,
wherein the high-voltage p-type metal-oxide-semiconductor (PMOS) transistor is characterized by a breakdown voltage higher in magnitude than a voltage drop between a maximum bootstrap voltage and the power supply voltage.

13. The gate driver circuit of claim 12, wherein the bootstrap control circuit including:
a resistor coupled between the source and a gate of the high-voltage PMOS transistor; and
a current source coupled to the gate of the high-voltage PMOS transistor, the current source configured to be turned on by a control signal to cause a current flow in the resistor resulting in a gate-source voltage to turn on the high-voltage PMOS transistor.

14. The gate driver circuit of claim 13, wherein the current source in the bootstrap control circuit comprises a constant current source and a current mirror, providing a constant gate-source voltage of the high-voltage PMOS transistor independent of the power supply voltage and the bootstrap voltage.

15. The gate driver circuit of claim 14, wherein the constant current source comprises an MOS transistor controlled by a constant reference voltage.

16. The gate driver circuit of claim 14, wherein the current mirror includes a first transistor and a second transistor, and the current source further comprises a first switch and a second switch responsive to the control signal, wherein:
the first switch is coupled between the gate of the constant current source and the first transistor of the current mirror; and
the second switch is coupled between the gate of the high-voltage PMOS transistor and the second transistor of the current mirror.

17. The gate driver circuit of claim 13, wherein the bootstrap control circuit is coupled to a virtual ground at the third output terminal of the gate driver for coupling to the midpoint of the switching half-bridge circuit.

18. The gate driver circuit of claim 12, wherein the high-voltage PMOS transistor comprises an asymmetric P-channel device having a drift region for sustaining a high voltage drop.

19. The gate driver circuit of claim 12, wherein the high-voltage PMOS transistor is the only high-voltage transistor coupled between the anode and the cathode of the bootstrap diode circuit.

20. The gate driver circuit of claim 12, wherein the bootstrap capacitor is included in a same integrated circuit (IC) chip as the gate driver circuit.

* * * * *